(12) United States Patent
Slavin et al.

(10) Patent No.: US 7,678,475 B2
(45) Date of Patent: Mar. 16, 2010

(54) SPIN-TORQUE DEVICES

(76) Inventors: Andrei N. Slavin, 721 McGill Dr., Rochester Hills, MI (US) 48309; Ilya N. Krivorotov, 2019 E. Los Trancos Dr., Irvine, CA (US) 92617

(*) Notice: Subject to any disclaimer, the term of this patent is extended or adjusted under 35 U.S.C. 154(b) by 922 days.

(21) Appl. No.: 11/418,958

(22) Filed: May 5, 2006

(65) Prior Publication Data
US 2007/0259209 A1 Nov. 8, 2007

(51) Int. Cl.
*G11B 5/33* (2006.01)
(52) U.S. Cl. .............. 428/811; 428/811.1; 428/811.2; 428/811.5; 360/324.2; 257/421
(58) Field of Classification Search .............. None
See application file for complete search history.

(56) References Cited

U.S. PATENT DOCUMENTS

| | | | | |
|---|---|---|---|---|
| 7,492,631 | B1* | 2/2009 | Assefa et al. ............ | 365/171 |
| 7,532,504 | B2* | 5/2009 | Saito ....................... | 365/158 |
| 2004/0057162 | A1* | 3/2004 | Gill ......................... | 360/314 |
| 2006/0227466 | A1* | 10/2006 | Yagami .................... | 360/324.2 |
| 2008/0230819 | A1* | 9/2008 | Nguyen et al. ........... | 257/295 |

OTHER PUBLICATIONS

Mohanty, P., Nature, 437, Sep. 2005, 325-326.*
Kaka, S., Pufall, M., Rippard, W., Silva, T., Russek, S., and Katine, J., Nature, 437, Sep. 2005, 389-392.*
Mancoff, F., Rizzo, N., Engel, B., and Tehrani, S., Nature, 437, Sep. 2005, 393-395.*

* cited by examiner

*Primary Examiner*—Kevin M Bernatz
(74) *Attorney, Agent, or Firm*—Gifford, Krass, Sprinkle, Anderson & Citkowski, P.C.

(57) ABSTRACT

Spin-torque devices are based on a combination of giant magnetoresistance (GMR) and tunneling magnetoresistance (TMR) effects. The basic structure has various applications, including amplifiers, oscillators, and diodes. For example, if the low-magnetoresistance (GMR) contact is biased below a critical value, the device may function as a microwave-frequency selective amplifier. If the GMR contact is biased above the critical value, the device may function as a microwave oscillator. A plurality of low- and high-magnetoresistance contact pairs may be induced to oscillate in a phase-locked regime, thereby multiplying output power. The frequency of operation of these devices will be tunable by the external magnetic field, as well as by the direct bias current, in the frequency range between 10 and 100 GHz. The devices do not use semiconductor materials and are expected to be exceptionally radiation-hard, thereby finding application in military nanoelectronics.

9 Claims, 2 Drawing Sheets ferromagnetic metal    non-magnetic metal non-magnetic insulator

SPIN-TORQUE DEVICES

FIELD OF THE INVENTION

This invention relates generally to spin-torque devices and, in particular, to devices based on a combination of giant magnetoresistance (GMR) and tunneling magnetoresistance (TMR) effects.

BACKGROUND OF THE INVENTION

It is well known that an electron carries not only a quantum of charge, but also a quantum of spin angular momentum, and, thus, electrical currents can transport spin. The utilization of this spin degree of freedom in electronics is tempting, but not trivial because spin-flip scattering in a conducting medium can result in the rapid loss of spin information. The characteristic length scale over which spin information is erased in metals typically does not exceed one micrometer, making the practical use of spin a significant technological challenge. However, recent advances in nanofabrication put spintronic devices with new functionalities within reach [1].

One such putative spintronic device is a microwave voltage-controlled oscillator based on the spin-transfer effect in nanoscale spin valves [1] and nanocontacts to magnetic multilayers [2] FIG. 1(a) shows a nanoscale spin valve having a diameter on the order of 100 nm. When current, I, flows perpendicular to the ferromagnetic layers (Co), a thicker (fixed) ferromagnetic layer serves as a current polarizer and spin-polarized current is injected into the non-magnetic spacer layer (Cu). This spin-polarized current then exerts spin torque on magnetization of the thinner (free) ferromagnetic layer and excites magnetization precession in this layer.

FIG. 1(b) shows a nanocontact to a magnetic multilayer having a diameter on the order of 40 nm. Spin-polarized current injected through the nanocontact excites oscillations of magnetization of the free layer directly under the contact. These oscillations generate spin waves in the free layer that propagate away from the contact. In these multilayer devices, current flows perpendicular to the layers and current densities as high as ~$10^9$ A/cm2 can be achieved.

A thicker (fixed) ferromagnetic layer in these devices serves as a current spin polarizer. When the polarized current enters the thinner (free) layer, it transfers angular momentum to the free layer and thereby exerts torque (called spin torque) on its magnetization [3]. At large enough current densities, the magnitude of the spin torque becomes comparable to the torque caused by the natural magnetic dissipation in the material of the free layer, and the total effective dissipation of magnetic energy becomes negative. This negative effective dissipation leads to the dynamic instability of magnetization of the free layer. Depending on the magnitude of the external bias magnetic field, this instability can lead to either magnetization reversal [1] or to persistent auto-oscillations of magnetization at GHz frequencies [2, 4].

The auto-oscillations of magnetization of the free layer result in a microwave voltage generated by the current-biased device via the giant magnetoresistance (GMR) effect. The frequency of the generated microwave signal was shown to be a strong function of the bias current and the magnitude and direction of the bias magnetic field [2, 4, 5], which makes the spin torque devices promising candidates for nanoscale tunable microwave oscillators.

The development of practical microwave devices based on the spin-torque effect requires, however, a detailed understanding of a number of fundamental properties of the current-driven excitations of magnetization. In particular, at present there are no direct experimental measurements of the spatio-temporal profile of the magnetic excitations driven by spin current and, thus, the question of the nature of the experimentally observed current-driven excitations remains open.

The magnitude of the microwave signals generated by spin transfer devices undoubtedly points to a very large amplitude of the current-driven spin waves [5]. This implies that these spin waves are of a highly nonlinear nature, and it is not clear that standard equations of magnetization dynamics that successfully describe spin waves in linear and moderately nonlinear regimes can give quantitative description of the spin torque excitations. Therefore, the development of spin torque microwave devices requires direct experimental measurements of the properties of current-driven nonlinear spin waves, such as propagation velocity, wavelength, and attenuation as well as development of the comprehensive theory of spin wave excitation by spin-polarized current.

SUMMARY OF THE INVENTION

This invention relates generally to spin-torque devices and, in particular, to devices based on a combination of giant magnetoresistance (GMR) and tunneling magnetoresistance (TMR) effects. Broadly, a spin-torque device according to the invention comprises a spin-wave waveguide, a low-magnetoresistance (GMR) contact to the waveguide providing a signal input, and a high-magnetoresistance contact to the waveguide providing a signal output.

In the preferred embodiment, the low-magnetoresistance contact to the waveguide is based on giant magnetoresistance (GMR), and the high-magnetoresistance contact to the waveguide is based on tunneling magnetoresistance (TMR). The contact are, essentially, nanocontacts, and the waveguide is substantially one-dimensional.

The basic structure has various applications, including amplifiers, oscillators, and diodes. For example, if the low-magnetoresistance (GMR) contact is biased below a critical value, the device may function as a microwave-frequency selective amplifier. If the (GMR) contact is biased above the critical value, the device may function as a microwave oscillator. A plurality of low- and high-magnetoresistance contact pairs may be induced to oscillate in a phase-locked regime, thereby multiplying output power.

The frequency of operation of these devices will be tunable by the external magnetic field, as well as by the direct bias current, in the frequency range between 10 and 100 GHz. The devices do not use semiconductor materials and are expected to be exceptionally radiation-hard, thereby finding application in military nanoelectronics.

DETAILED DESCRIPTION OF THE INVENTION

This invention broadly resides in nano-scale, spin-torque devices that utilize current-driven spin waves for microwave signal processing. As an introduction, the device of FIG. 2 comprises a metallic ferromagnetic nanowire with nominal dimensions of ~5 nm thick, ~50 nm wide, and ~5 mm long. A number of ferromagnetic leads are attached via non-magnetic metallic spacers (GMR leads). These leads make contact to the wire in several places along its length forming a series of magnetic nanocontacts that serve as spin-polarized current injectors. When a large enough voltage is applied to a particular lead, spin current injected into the wire excites magnetization oscillations under the injector. These excitations of magnetization propagate along the wire as spin waves and induce microwave voltage signals at the neighboring DC-biased nanocontacts. Thus, the nanowire acts as a one-dimensional (1D) waveguide for the current-driven spin waves that provide coupling among the nanocontacts.

Figure 1A:
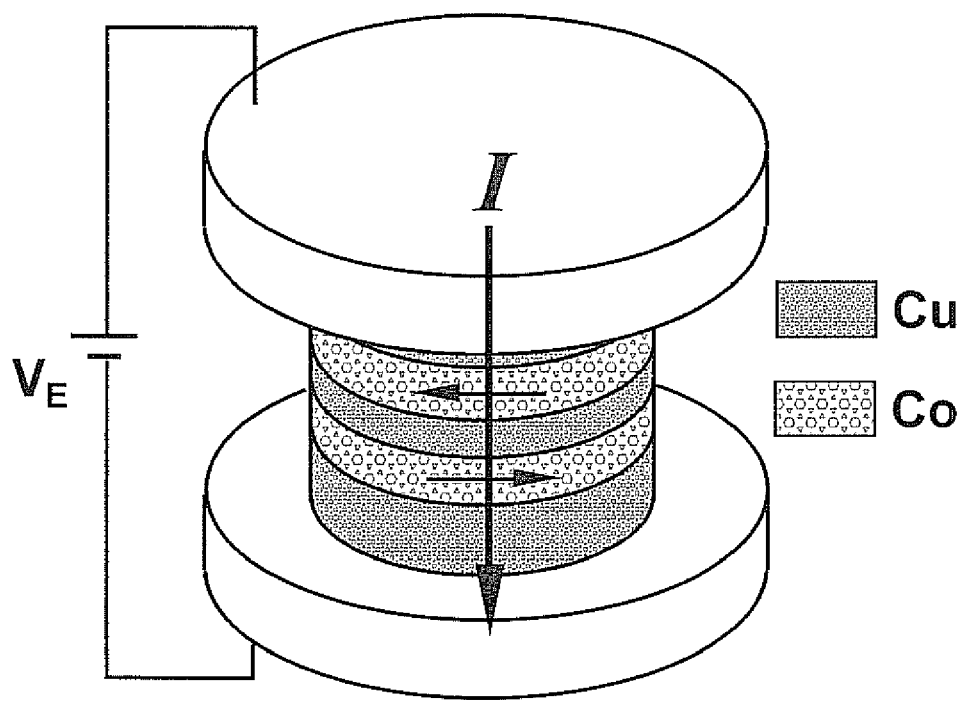
FIG. 1(a) shows a nanoscale spin valve having a diameter on the order of 100 nm.
Figure 1B:
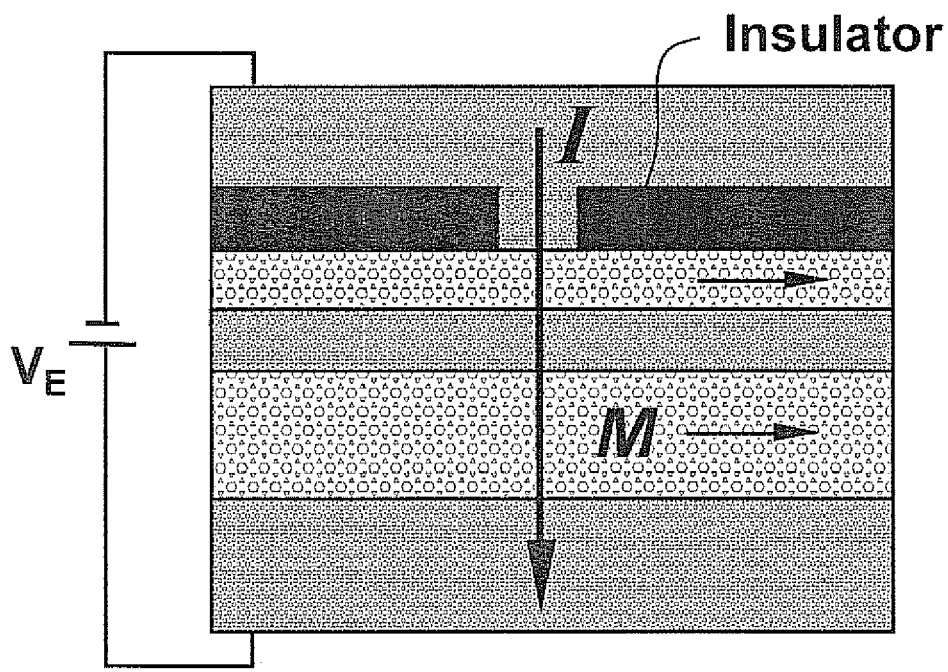
FIG. 1(b) shows a shows a nanocontact to a magnetic multilayer having a diameter on the order of 40 nm.

An important advantage of the device geometry just described is the much stronger influence of the propagating spin waves excited by a particular nanocontact on the neighboring nanocontacts compared to the existing geometries. For example, the spin transfer device shown in FIG. 1($b$) is a two-dimensional system, in which the intensity of the propagating spin waves decays with the distance r as (1/r) even in a conservative medium. In an actual experimental situation the factor (1/r) gives about a 10-fold decrease of the strength of coupling between the neighboring nanocontacts. In contrast with the two-dimensional geometry, where the free layer of a nanocontact is an infinite film, the proposed one-dimensional geometry allows the spin wave propagation between the neighboring nanocontacts, but does not impose any geometric decay. Therefore the interaction between neighboring nanocontacts is expected to be stronger than in other cases.

Recently observed diode effects in spin-transfer magnetic elements [10] further enables the development of a new class of phase-sensitive microwave detectors. Being intrinsically resonant, these detectors will be much less sensitive to thermal noise than the conventional broadband semiconductor diode detectors. The new microwave diode effect results from spin-wave generation by spin-polarized current and the GMR effect. The microwave current $I(t)=I_o e^{-iwt}+c.c.$ passing through the nanocontact generates the magnetization precession at the same frequency, $m=m_o e^{-i\omega t+i\phi}+c.c$, which modifies the nanocontact resistance via GMR. As a result, a constant voltage $V=<R(t)I(t)>\sim I_o m_o \cos(\phi)$ is induced at the nanocontact. The precession amplitude $m_o$ is significant only for the external ac current frequency that is close to the ferromagnetic resonance (FMR) frequency of the free layer. Thus, the bandwidth of the diode effect is proportional to the FMR linewidth of the free layer (typically ~100 MHz).

Figure 2:
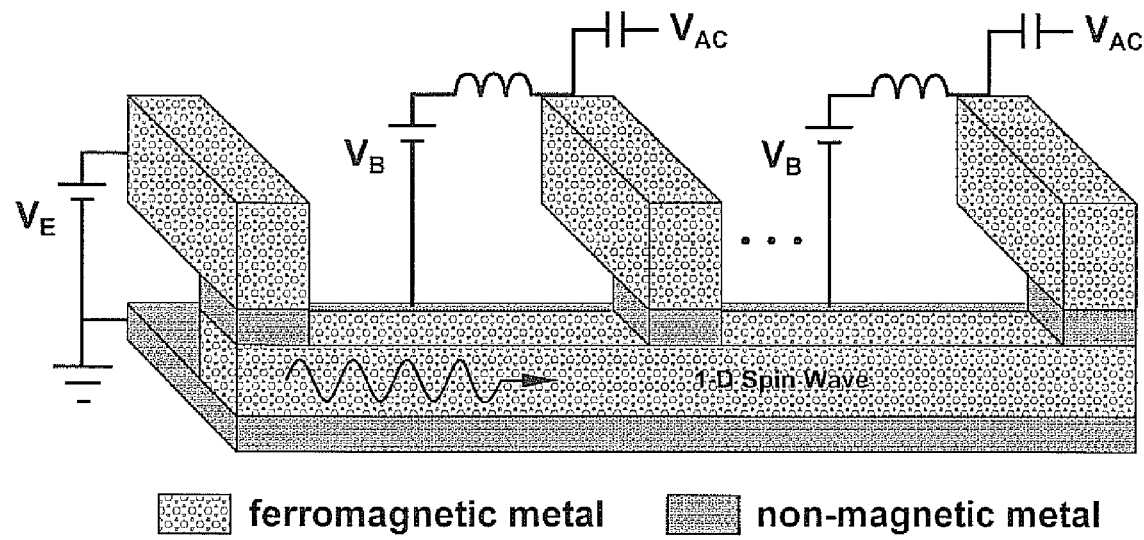
FIG. 2 depicts a metallic ferromagnetic nanowire device comprising an array of GMR nano-contacts coupled to a spin-wave waveguide.

The device geometry of FIG. 2, where the free layer has a shape of a one-dimensional waveguide, allows one to further decrease the bandwidth of the diode effect. If the AC current is applied to all the nanocontacts, the spin waves generated by each of the contacts will propagate inside the waveguide, and the amplitude of the magnetization precession at each contact will be a sum (with the account of the phase) of contributions of spin waves generated by all nanocontacts in the array. The individual spin waves will interfere either constructively or destructively, depending on the phase shift acquired during the spin wave propagation. As such, the one-dimensional array of magnetic nanocontacts works as a diffraction grating for spin waves. In this case, the bandwidth of generation will be determined by the spacing between the nanocontacts and by the number of the contacts in the array, and could be much smaller than the FMR linewidth in a continuous 2D free layer.

As a result, the proposed device will operate as ultra-narrow-bandwidth microwave detector.

Figure 3:
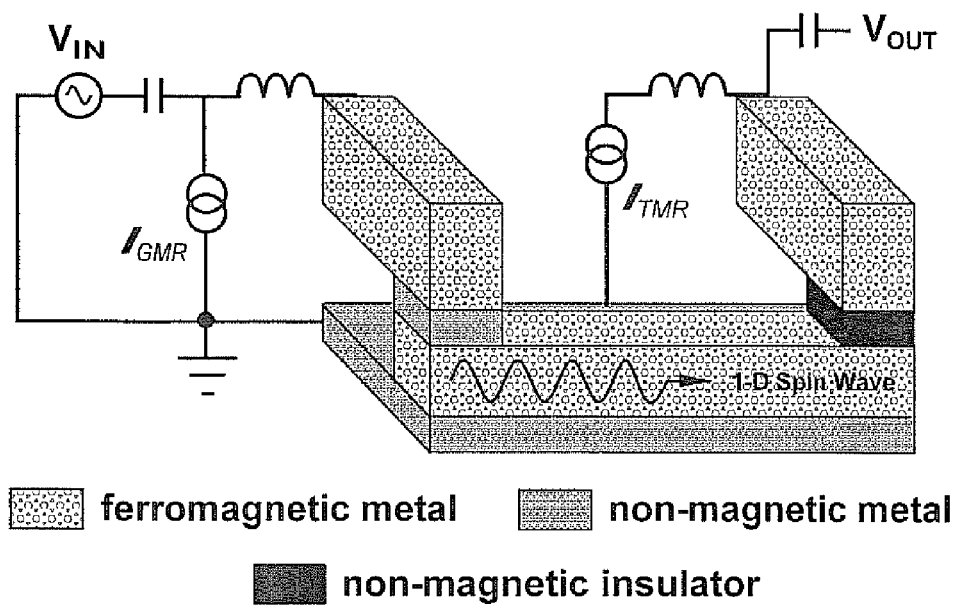
FIG. 3 illustrates a "spin-torque transistor" based on a combination of GMR and TMR effects in two neighboring magnetic nanocontacts coupled to a spin-wave waveguide.

Spin-Torque Devices Based on GMR and TMR Nanocontacts Connected by a Spin-Wave Waveguide A new type of device according to the invention comprises one GMR contact (thin spacer made of a nonmagnetic metal) and one TMR contact (the spacer made of an insulator) formed on the same spin wave guide. As shown in FIG. 3, the geometry of this "spin-torque transistor" is based on a combination of GMR and TMR effects in two neighboring magnetic nanocontacts coupled to a spin-wave waveguide. The basic structure has various applications, including amplifiers, oscillators, and diodes (as discussed above, wherein the TMR contact may not be necessary).

If the bias direct current through the GMR contact is below a critical value, the device will amplify the input microwave signal. By changing the magnitude of this sub-critical bias direct current we can control the amplification gain, analogous to a gate current. If the bias direct current through the GMR contact is above the critical value, the GMR contact will generate its own microwave signal, which, again, will be amplified due to the difference of GMR and TMR resistances, and the device will work as an independent microwave oscillator. The frequency of this oscillator may be varied by changing the bias magnetic field and by changing the bias direct current through the GMR contact. Of course, the bias current through the GMR contact will also change the output amplitude.

Continuing the reference to FIG. 3, a small AC voltage $V_{IN}$ applied to the left low resistance (GMR) nanocontact creates a spin-polarized current that excites a spin wave propagating in the nanowire waveguide towards the right high-resistance (TMR) nanocontact. The precession of magnetization under the TMR nanocontact, caused by the propagating spin wave, creates large microwave variations in the resistance of the TMR nanocontact biased by a direct current $I_{TMR}$ and, therefore, a large-amplitude microwave output voltage $V_{OUT}$.

The device combines the advantages of the GMR and TMR nanocontacts. The spin waves that propagate towards the TMR contact modifies its resistance, $R \rightarrow R_0+\Delta R(t)$. If the TMR contact is biased by the constant sub-critical current $I_0$, the voltage at the TMR contact will have a significant AC component, $\Delta V(t) \approx I_0 \Delta R(t)$, which can be much larger than the AC voltage applied to the GMR contact, thereby functioning as a nanoscale-tunable frequency-selective amplifier.

To increase the sensitivity of the GMR contact to small external AC signals, it is possible to bias the device by substantial, but sub-critical DC current that has been experimentally proven to reduce the effective magnetic dissipation in the GMR nanocontact [5]. In this case the device will work as a regenerative amplifier. In principle, this same device can work as a diode detector, as the direct-current voltage on the TMR contact will depend on the amplitude of the input microwave signal applied to GMR contact (in the amplification regime), but this is a minor effect. Overall, the structure acts a magnetic analog of a semiconductor transistor, one that can operate in both amplification and generation regimes.

The practical use of current-induced microwave generation in magnetic nanocontacts is hindered by the low microwave power (~0.1 nW) generated by a single nanocontact. According to this invention, this problem is addressed through mutual phase-locking in an array of weakly coupled spin-transfer nano-oscillators [6-9]. In the phase-locked regime all the coupled nanocontact oscillators generate coherently, which significantly increases the generated power (~N2 times, where N is the number of phase-locked oscillators). A linear array of GMR/TMR pairs oscillating in a phase-locked regime may generate a significant power output of tens of microwatts or even milliwatts in the size 10-100 times smaller that that of microwave transistors based on semiconductor p-n junctions. An array of GMR contacts can also work as a frequency selective diode due to the signal interference.

A preliminary theoretical analysis shows that the main effect leading to the self-phase-locking in an array of generating nanocontacts is the interaction through the spin waves propagating in the common free layer, rather than direct magneto-dipole interaction of nanocontacts or the coupling through the generated ac voltage. Recent experiments [6, 8, 9] performed in the two-dimensional nanocontact geometry similar to that shown in FIG. 1(b) have shown that although the phase locking of two neighboring nanocontacts is possible, the frequency band of the phase locking is relatively narrow (100 MHz) [8] and the effect is not well reproduced on all devices (FIG. 3 in [9]). Thus, a stronger coupling between the neighboring nanocontacts is required for practical devices [7].

Amplifier Figures of Merit

There are three important figures of merit for microwave semiconductor amplifiers, namely, gain; gain-bandwidth product (the frequency at which gain drops to 0 dB); and efficiency. As quantified below, these three parameters of the spin-torque amplifier are either similar or better than those of the conventional semiconductor transistors.

Geometry and Resistive Parameters

The spin-torque amplifier using GMR and TMR nanocontacts connected by a spin wave waveguide (length a=50 nm, width W=100 nm, thickness 4-5 nm). Due to this novel geometry it is possible to supply different AC and DC voltages on these two nanocontacts.

A typical TMR nanocontact has 100×100 nm$^2$ in-plane size and is made with 1.15-nm thick MgO dielectric between "fixed" and "free" layers made of ferromagnetic metals. It was recently demonstrated that the resistance-area product for the 1.15-nm thick MgO is 3 Ohm µm$^2$, so the resistance of a 100×100 nm$^2$ TMR nanocontact is approximately $R_{TMR}$=300 Ohm. The TMR coefficient (maximum variation of resistance with variation of relative orientations of magnetizations in the "free" and "fixed" layers) of such a nanocontact with CoFe electrodes is $K_{TMR}$=115% [14].

A typical GMR nanocontact has 60×120 nm$^2$ in-plane size and is made with 8-nm thick Cu spacer between the "fixed" and "free" layers made of ferromagnetic metals. A typical resistance of such a GMR nanocontact is $R_{GMR}$=5 Ohm [15]. The GMR coefficient (maximum variation of resistance with variation of relative orientations of magnetizations in the "free" and "fixed" layers) of such a nanocontact with permalloy electrodes is $K_{GMR}$~10% [15].

Gain

The AC voltage $v_{GMR}$ at the GMR contact creates magnetization precession with the angle $$\theta = \frac{v_{GMR}}{R_{GMR}} \frac{\sigma}{\Gamma(I_{GMR})} \quad (1)$$

where $R_{GMR}$ is the resistance of the GMR contact, σ is the spin-polarization parameter which is constant for a particular geometry of the contact, and $\Gamma(I_{GMR})$ is the dissipative parameter in the "free" ferromagnetic layer of the contact that can be varied from the magnitude proportional to the ferromagnetic resonance (FMR) linewidth in the "free" layer for zero DC bias current $I_{GMR}$ through the GMR contact ($\Gamma=\Gamma_{FMR}$ for $I_{GMR}$=0) to almost ZERO for the bias current close to the critical current $I_c=\Gamma_{FMR}/\sigma$~2 mA at which the microwave generation in the contact starts ($\Gamma\approx0$ for $I_{GMR}=I_c=\Gamma_{FMR}/\sigma$) Eq. (1) is valid for relatively small precession angles $\theta \leq 30°$.

Note, that in has been proven experimentally in [2] that the dissipation parameter Γ of the "free" layer of the GMR nanocontact can be reduced by at least 5-8 times if a moderate DC bias current $I_{GMR}$~1 mA is applied to the GMR contact (see FIG. 3d in [15] for details). Below we shall give a very conservative estimate of the amplifier gain coefficient in the case of zero DC bias current through the GMR contact, that will give us the lowest limit for the gain coefficient.

The microwave precession excited by the input microwave signal in the GMR contact will excite propagating spin wave in the connecting waveguide, and that wave will create changes of the resistance of the TMR contact $\Delta R = \Delta R_{max} \theta$, where $\Delta R_{max} = K_{TMR} R_{TMR}$ is the magnetoresistance of the TMR contact. If the TMR contact is biased by the DC current $I_{TMR}$ (typical value is $I_{TMR}$=1-2 mA [1]) then the AC voltage at the TMR contact will be:

$$v_{TMR} = I_{TMR} \Delta R = I_{TMR} K_{TMR} \frac{R_{TMR}}{R_{GMR}} \frac{\sigma}{\Gamma(I_{GMR})} v_{GMR} \quad (2)$$

and the gain coefficient $G=v_{TMR}/v_{GMR}$ of the GMR/TMR amplifier is given by:

$$G = \frac{v_{TMR}}{v_{GMR}} = K_{TMR} \frac{R_{TMR}}{R_{GMR}} \frac{I_{TMR}}{[\Gamma(I_{GMR}=0)/\sigma]} \quad (3)$$
$$= 1.15 \frac{300 \ Ohm}{5 \ Ohm} \frac{1.5 \ mA}{2 \ mA} \approx 50$$

which gives 34 dB gain in microwave power.

If a moderate sub-critical DC current of $I_{GMR}$~1 mA is applied to the GMR contact, the dissipation coefficient Γ can be reduced and the gain coefficient G can be increased by at least 5 times compared to the estimation given by Eq. (3), resulting in 50 dB power amplification.

In semiconductor transistor amplifiers, gain depends on the frequency of operation but the maximum gain at a few GHz is typically between 10 dB and 20 dB. This means that spin-torque amplifier will exhibit substantially higher power gain, than a typical semiconductor transistor amplifier.

Gain-Bandwidth Product

A significant problem with conventional semiconductor high-frequency amplifiers is the roll-off of gain at high frequencies due to intrinsically large capacitance of the forward-biased junctions. The most important figure of merit for a high frequency transistor is the gain-bandwidth product, $f_T$, which characterizes the frequency at which gain drops to 0 dB. For silicon transistors the typical value of $f_T$ is 10 GHz while for special SiGe, GaAs and GaN transistors the typical value of $f_T$ is 20 GHz. This high-frequency gain roll-off presents a significant challenge for designing microwave amplifier with operational frequencies above 20 GHz (K-band).

Spin-torque amplifier according to this invention will have values of $f_T$ which are more than an order of magnitude higher than those of semiconductor transistors while essentially eliminating the gain roll-off problem of microwave signal amplification. Indeed, the resistance and capacitance of the amplifier is dominated by the resistance and capacitance of the tunnel junction $R_{TMR}$ and $C_{TMR}$. For an MgO tunnel junction described above $R_{TMR}$=300 Ohm and $$C_{TMR} = \varepsilon\varepsilon_0 \frac{A}{d} \approx 0.0008 \text{ pF}$$

where A is the area of the tunnel junction $A=10^{-14}$ m², $d=1.15 \cdot 10^{-9}$ m is the MgO thickness and $\varepsilon\approx10$ is the dielectric constant of MgO. Using a simple model for the calculation of the gain-bandwidth product [16], we obtain $$f_T = \frac{1}{2\pi R_{TMR} C_{TMR}} \approx 660 \text{ GHz}.$$

This high value of $f_T$ means that the gain of the spin-torque amplifier designed to operate at 50 GHz will be the same as that designed to operate at 2 GHz. This feature is truly unique to the spin-torque amplifier disclosed herein.

Efficiency

There is a trade-off between the amplifier fidelity and its efficiency. The high values of magneto-resistance achievable with MgO (up to 340% [17]) allow efficiency parameters as high as 40% for a 90-degree-amplitude precession of magnetization in the spin-torque amplifier. However, this high efficiency comes at a cost of non-linear signal distortions. In the linear regime, for precession angles not exceeding 30 degrees the efficiency drops to about 10%. These numbers are rather typical for microwave transistors.

New Facility for the Frequency-Selective GMR/TMR Amplifier

Structural simplicity: currently-used frequency-selective amplifiers use a few transistors in combination with passive components including inductors which make the circuit very bulky (a typical on-chip inductor takes about 0.01 mm² of chip space). Our design replaces all these active and passive components with one simple nano-scale device. This gives at least 2 orders of magnitude improvement of the chip real estate usage.

Impedance-Matching of the Amplifier Output to the 50-Ohm Circuitry

As it was mentioned above, a typical TMR nanocontact has a resistance of $R_{TMR}$=300 Ohm. For such a nanocontact, the power delivered to a 50-Ohm load will be reduced (in comparison to the power delivered to a matched load) by the power transmission $$\text{coefficient } 1 - \Gamma^2 = 1 - \left(\frac{50 - R}{50 + R}\right)^2 = 0.49.$$

Therefore, the power delivered to a standard 50-Ohm load will be only a half of that delivered to a matched load. This 50% reduction is not very significant considering the high gain expected for the spin-torque GMR/TMR amplifier.

Oscillator Figures of Merit

A few figures of merit characterize voltage-controlled oscillators (VCOs), namely, Quality factor; Modulation sensitivity; Output power; Tuning range; and Bias current and voltage. Since our spin-torque oscillators are compatible with relatively inexpensive Si CMOS technology, we will compare the spin torque oscillator to the typical Si-based on-chip oscillator used in wireless communications for microwave signal modulation/demodulation.

Quality factor

Quality factors of up to 20,000 were demonstrated for single generating spin-torque nanocontacts [14]. This quantity can only increase in a phase-locked array of generating nanocontacts (roughly by $N^{1/2}$ times, where N is the number of phase-locked nanocontacts), that we propose to use as a spin-torque oscillators. This high quality factor can be compared to the Si-based VCO which employ varactors and on-chip inductors for frequency tuning. Typical quality factors achieved by these oscillators with active feedback are ~100,000.

We expect that such quality factors for an array of phase-locked spin-torque oscillators without feedback will be achieved for N~100 phase-locked oscillators. It is feasible that with feedback circuitry in place the spin-torque oscillators will exceed the quality factors of the conventional on-chip VCOs.

Modulation Sensitivity

Spin-torque oscillators have much higher modulation sensitivity than conventional on-chip VCOs. A typical modulation sensitivity of a spin torque oscillator is ~100,000 MHz/V which is three orders of magnitude larger than the typical modulation sensitivity of a conventional VCO ~100 MHz/V.

Output Power

The output power generated by the spin-torque VCO that is based on an array of 100 phase-locked nanocontacts is expected to be ~0.01 mW.

This number can be significantly improved if an array of phase-locked hybrid GMR/TMR devices is used as a tunable oscillator. For such a device, the output power in excess of 1 mW can be achieved, which is similar to that generated by conventional on-chip VCOs.

Since the spin-torque oscillators can be produced in parallel by advanced photo-lithography and etching techniques, and they take a few orders of magnitude less area than the conventional VCOs, the arrays of hybrid GMR/TMR spin-torque oscillators can generate microwave power per chip area significantly exceeding that achievable with any conventional VCO.

Tuning Range

Typical tuning range for a conventional VCO is ~10%. Spin-torque excitation frequency can be tuned in a range exceeding 50% [15, 18]. Therefore, the tuning range of the spin-torque oscillators is at least several times higher than that of conventional VCOs. Note, also that spin-torque VCOs can be tuned by both external magnetic bias field and by the bias DC current passing through the generating nanocontacts. Typical central frequency can be chosen in the interval of 10-40 GHz [18] (see e.g FIG. 4 in [18]).

It is important to note, that the presence of the bias magnetic field is not necessary neither for the operation of the spin-torque VCO at a fixed frequency, nor for its tuning in the 50% frequency range.

The static bias field necessary for the saturation of the "free" ferromagnetic layer of the device (typically made of permalloy) can be provided by the shape anisotropy of the "free" layer made in the form of a rectangular nano-sized waveguide and will be sufficient to work in the 5-10 GHz frequency range.

Bias Current and Voltage

Spin-torque VCO requires much lower bias voltage ($V_{bias}$~20 mV, $I_{bias}$~400 mA for an array for 100 contacts) than the conventional VCO which typically needs $V_{bias}$~5 V, $I_{bias}$~20 mA), thus resulting in one order of magnitude lower power consumption than conventional VCOs.

New Facility for the Spin-Torque Voltage-Controlled Oscillators
  (i) Much greater structural simplicity than the currently-used voltage-controlled oscillators employing transistors, varactors, and inductors,
  (ii) True nano-scale dimensions of the device and, thus, scalability that opens up new routes for wireless chip-to-chip communications.

REFERENCES

[1] J. A. Katine, F. J. Albert, R. A. Buhrman, E. B. Myers, and D. C. Ralph, Phys. Rev. Lett. 84, 3149 (2000).
[2] W. H. Rippard, M. R. Pufall, S. Kaka, S. E. Russek, and T. J. Silva, Phys. Rev. Lett. 92, 027201 (2004).
[3] J. C. Slonczewski, J. Magn. Magn. Mater. 159, L1 (1996).
[4] S. I. Kiselev, J. C. Sankey, I. N. Krivorotov, N. C. Emley, R. J. Schoelkopf, R. A. Buhrman, and D. C. Ralph, Nature 425, 380 (2003).
[5] I. N. Krivorotov, N. C. Emley, J. C. Sankey, S. I. Kiselev, D. C. Ralph, and R. A. Buhrman, Science 307, 228 (2005).
[6] W. H. Rippard, M. R. Pufall, S. Kaka, T. J. Silva, S. E. Russek, and J. A. Katine, Phys. Rev. Lett. 95, 067203 (2005).
[7] A. N. Slavin and V. S. Tiberkevich, Phys. Rev. B 72, 092407 (2005).
[8] S. Kaka, M. R. Pufall, W. H. Rippard, T. J. Silva, S. E. Russek, and J. A. Katine, Nature 437, 389 (2005).
[9] F. B. Mancoff, N. D. Rizzo, B. N. Engel, and S. Tehrani, Nature 437, 393 (2005).
[10] A. A. Tulapurkar, Y. Suzuki, A. Fukushima, H. Kubota, H. Maehara, K. Tsunekawa, D. D. Djayaprawira, N. Watanabe, and S. Yuasa, Nature 438, 339 (2005).
[11] A. N. Slavin and P. Kabos, IEEE Trans. Mgn. 41, 1264 (2005).
[12] A. N. Slavin and V. S. Tiberkevich, Phys. Rev. Lett. 95, 237201 (2005).
[13] A. N. Slavin and V. S. Tiberkevich, Phys. Rev. B 72, 094428 (2005).
[14] Jun HAYAKAWA, Shoji IKEDA, Fumihiro MATSUKURA, Hiromasa TAKAHASHII, and Hideo OHNO, "*Dependence of Giant Tunnel Magnetoresistance of Sputtered CoFeB/MgO/CoFeB Magnetic Tunnel Junctions on MgO Barrier Thickness and Annealing Temperature*", Japanese Journal of Applied Physics Vol. 44, No. 19, 2005, pp. L587-L589.
[15] I. N. Krivorotov, N. C. Emley, J. C. Sankey, S. I. Kiselev, D. C. Ralph, R. A. Buhrman, "*Time-Resolved Measurements of Nanomagnet Dynamics Driven by Spin-Transfer Torques*", Science, 307, 228 (2005).
[16] P. Horowitz, W. Hill, *The Art of Electronics*, University Press, 1999, p. 867.
[17] W. J. Gallagher and S. S. P. Parkin, "*Development of the magnetic tunnel junction MRAM at IBM: From first junctions to a 16-Mb MRAM demonstration chip*", IBM J. Res. & Dev. 50, 5 (2006).
[18] W. H. Rippard, M. R. Pufall, S. Kaka, S. E. Russek, and T. J. Silva, "*Direct-current induced dynamics in Co90Fe10/Ni80Fe20 point contacts*", Phys. Rev. Lett. 92, 027201 (2004).

We claim:

1. A spin-torque device, comprising:
  a non-magnetic electrically conductive substrate;
  a ferromagnetic waveguide making direct contact to the substrate;
  a giant magnetoresistance (GMR) contact to the waveguide, the GMR contact being electrically biased relative to the substrate to receive a signal input; and
  a tunneling magnetoresistance (TMR) contact to the waveguide, the TMR contact being electrically biased relative to the substrate to provide a signal output.

2. The device of claim 1, wherein the GMR contact is made to the waveguide through a thin spacer made of a nonmagnetic metal.

3. The device of claim 1, wherein the TMR contact is made to the waveguide through an insulating spacer.

4. The device of claim 1, wherein the GMR and TMR contacts are nanocontacts.

5. The device of claim 1, wherein the ferromagnetic waveguide functions as a one-dimensional waveguide.

6. The device of claim 1, wherein the GMR contact is biased below a critical value, enabling the device to function as an amplifier.

7. The device of claim 1, wherein the GMR contact is biased above a critical value, enabling the device to function as a microwave oscillator.

8. The device of claim 1, wherein the biasing between the GMR contact and the substrate is a direct-current (DC) bias.

9. The device of claim 1, wherein the biasing between the TMR contact and the substrate is a direct-current (DC) bias.

* * * * *